United States Patent [19]
Lincoln

[11] Patent Number: 6,072,362
[45] Date of Patent: Jun. 6, 2000

[54] SYSTEM FOR ENABLING A FULL-BRIDGE SWITCH-MODE AMPLIFIER TO RECOVER ALL REACTIVE ENERGY

[75] Inventor: Daniel J. Lincoln, Brockport, N.Y.

[73] Assignee: Ameritherm, Inc., Scottsville, N.Y.

[21] Appl. No.: 09/113,552

[22] Filed: Jul. 10, 1998

[51] Int. Cl.$^7$ .................................................. H03F 3/38
[52] U.S. Cl. ............................................. 330/10; 330/251
[58] Field of Search ............................. 330/207 A, 146, 330/251, 297, 10

[56] References Cited

U.S. PATENT DOCUMENTS

| | | | |
|---|---|---|---|
| 4,056,786 | 11/1977 | Morrison et al. | 330/207 A |
| 4,743,858 | 5/1988 | Everard | 330/10 |
| 4,860,152 | 8/1989 | Osborn | 361/91 |
| 4,894,621 | 1/1990 | Koenig et al. | 330/251 |
| 4,949,050 | 8/1990 | Swanson | 330/298 |
| 5,187,580 | 2/1993 | Porter, Jr et al. | 330/207 |
| 5,191,302 | 3/1993 | Rossnick | 331/109 |
| 5,420,537 | 5/1995 | Weedon et al. | 330/251 |
| 5,515,002 | 5/1996 | Ideler | 330/251 |

OTHER PUBLICATIONS

Jeff Sherman, Dave Hamo, "Phase–Shifted, Zero–Voltage Switching Made Easy", Electronic Design, vol. 44, No. 6, p 105, Mar. 18, 1996.

*Primary Examiner*—Benny Lee
*Assistant Examiner*—Henry Choe
*Attorney, Agent, or Firm*—Mintz, Levin, Cohn, Ferris, Glovsky and Popeo, P.C.

[57] ABSTRACT

A full-bridge amplifier that is able to provide power to all types of loads. The fill-bridge amplifier according to the present invention recovers reactive energy produced by capacitive loads instead of having the reactive energy be dissipated in the switches of the amplifier, thereby causing device failure. In one embodiment, two inductors and four diodes are added to the conventional full-bridge topology. Furthermore, a full-bridge amplifier according to an embodiment of the present invention is able to operate over a broad-band of radio frequencies.

52 Claims, 8 Drawing Sheets

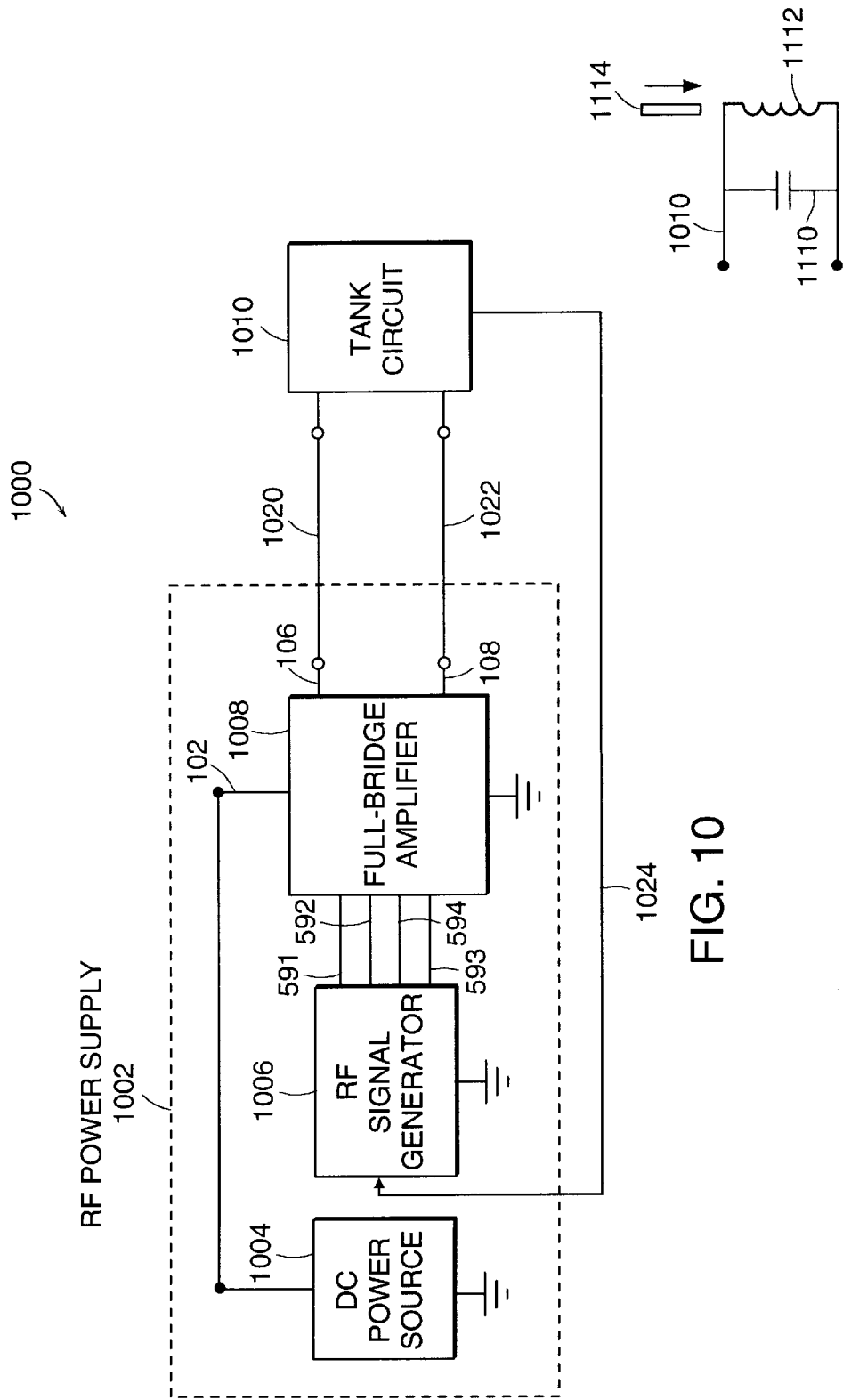

SYSTEM FOR ENABLING A FULL-BRIDGE SWITCH-MODE AMPLIFIER TO RECOVER ALL REACTIVE ENERGY

BACKGROUND OF THE INVENTION

1. Field of the Invention

The present invention relates generally to switch-mode amplifiers. More particularly, the present invention relates to a full-bridge amplifier that can recover all reactive energy. The present invention is useful in induction heating and plasma applications, but by no means is limited to such applications.

2. Related Art

Induction heating is a method of heating electrically conductive materials such as metals. Induction heating relies on, as the name implies, inducing electrical currents within a material to be heated. These induced currents, called eddy currents, dissipate energy and bring about heating. Common uses of induction heating include: heat treating, welding, and melting.

Prior to the development of induction heating, gas and oil-fired furnaces provided the prime means of heating metals and nonmetals. The advantages that induction heating offers over furnace techniques are numerous. For example, greater heating rates can be achieved by induction heating than can be achieved by gas or oil furnaces. Higher heating rates lead to shorter heating times, which lead to productivity increases and reduced labor costs. Furthermore, given today's environmental concerns, induction heating is an attractive alternative to pollution producing furnaces.

The basic components of an induction heating system are a tank circuit having an inductor coil, an RF power supply, and the material to be heated -i.e., the work piece. The work piece is heated by placing the work piece within the inductor coil of the tank circuit and applying a high-power, RF alternating voltage to the tank circuit using the RF power supply. The RF voltage applied to the tank circuit causes an alternating current to flow through the inductor coil. The flow of an alternating current through the inductor coil generates an alternating magnetic field that cuts through the work piece placed in the inductor coil. It is this alternating magnetic field that induces the eddy currents that heat the work piece.

The work piece is heated most efficiently when the frequency of the RF voltage applied to the tank circuit matches the tank circuit's resonant frequency. That is, when the tank circuit is driven at its resonant frequency the transfer of power from the power supply to the tank circuit is maximized. Because the resonant frequency of the tank circuit changes as the work piece is heated, induction heating systems utilize an RF power supply having a tuning system for continuously tracking the resonant frequency of the tank circuit. By tracking the resonant frequency of the tank circuit, the RF power supply is better able to provide an RF voltage that matches the resonant frequency.

A variety of tank circuits are used in induction heating applications depending on the workpiece to be heated. In some applications it is desirable to have a tank circuit having a relatively low resonant frequency (e.g., 50 KHz), and in other applications a tank circuit having a relatively high resonant frequency (e.g., 1 MHz) is desired. Thus, it is desirable to have an RF power supply that can operate over a broad range of radio frequencies, thereby being able to provide optimum power to a wide variety of tank circuits.

A problem with conventional RF power supplies is that they are only able to provide power to inductive and resistive loads, not to capacitive loads. Total device failure may result if a conventional RF power supply attempts to deliver power to a capacitive load. In an induction heating process the load is the tank circuit in combination with the work piece. When the tank circuit is being driven at its resonance frequency the load appears to be fully-resistive. But, if the tank circuit is not being driven at its resonant frequency, the load may appear to be capacitive, and the RF power supply may experience device failure.

Unfortunately, tuning systems within RF power supplies are not always able to track the resonant frequency of a tank circuit. This is especially true when the resonant frequency is rapidly changing due to heating of the work piece. Thus, there will be times when an RF power supply is not driving a tank circuit at its resonant frequency. Consequently, there are times when the load will appear capacitive. In the situations where the load appears capacitive, the potential for complete device failure within the RF power supply is large. Capacitive loads create reactive energy that if not recovered can overload devices within the RF power supply causing a great deal of damage.

What is therefore desired is an RF power supply that is able to provide power to all types loads, be they inductive, resistive, or capacitive, without experiencing device failure. What is further desired is an RF power supply that is able to operate over a broad-band of radio frequencies so that a wide variety of work pieces can be heated with maximum efficiency.

SUMMARY OF THE INVENTION

The present invention provides a full-bridge amplifier that is able to provide high power, RF voltages to all types of loads, be they inductive, resistive, or capacitive. The full-bridge amplifier according to the present invention includes a means for recovering reactive energy produced by capacitive loads so that the reactive energy will not be dissipated in the switches of the amplifier, thereby causing device failure. Furthermore, a full-bridge amplifier according to one of the embodiments of the present invention is able to operate over a broad-band of radio frequencies. For example, a full-bridge amplifier according to one embodiment can operate over the entire frequency range between 50 KHz and 1.0 MHz while providing 3.5 kilo watts of power to a capacitive load.

The full-bridge amplifiers according to the present invention can be used to create a reliable RF power supply where the operator does not have to worry about proper load matching or inefficiencies in the tuning system. The improved RF power supply is useful in, among other things, induction heating and plasma generation applications.

A full-bridge amplifier according to a first embodiment of the present invention includes four switches, four diodes, and two inductors. The diodes and the inductors provide a means for recovering reactive energy produced by a capacitive load. As used herein, a "switch" is a device for making, breaking, or changing a connection in an electrical circuit, and the term "coupled" means directly or indirectly connected. A first device is indirectly connected to a second device when there are one or more other devices connected between the first and second device.

According to the first embodiment, the first switch is coupled between a power supply terminal and a first common node. The second switch is coupled between the first common node and a common reference node. The third switch is coupled between the power supply terminal and a second common node. The fourth switch is coupled between the second common node and the common reference node.

The first diode has its cathode coupled to the power supply terminal and its anode coupled to a third common node. The second diode has its cathode coupled to the third common node and its anode coupled to the common reference node. The third diode has its cathode coupled to the power supply terminal and its anode coupled to a fourth common node. The fourth diode has its cathode coupled to the fourth common node and its anode coupled to the common reference node.

The first inductor is coupled between the first common node and the third common node. The second inductor is coupled between the second common node and the fourth common node. A first output terminal is coupled to the third node and a second output terminal is coupled to the fourth node. A load can be coupled between the first and second output terminals. The full-bridge amplifier according to the first embodiment operates over the 100 KHz to 1.0 MHz frequency range a can provide up to 3.5 KW of power.

In a second embodiment of the present invention, each of the four switches are implemented with MOSFETs. In a third embodiment each switch is implemented with two MOSFETs connected in parallel. In a fourth embodiment, a capacitor is coupled across the first, second, third, and fourth diode.

A full-bridge amplifier according to a fifth embodiment of the present invention includes four switches, six diodes, and four inductors. The full-bridge amplifier according to the fifth embodiment has the additional advantage of being able to operate over a broad band of radio frequencies (e.g., 50 KHz–1.0 MHz) and delivers up to 3.5 KW of power. According to the fifth embodiment, the first switch is coupled between a power supply terminal and the cathode of the first diode. The second switch is coupled between the anode of the first diode and a common reference node. The third switch is coupled between the power supply terminal and the cathode of the second diode. The fourth switch is coupled between the anode of the second diode and the common reference node. The third diode has its cathode coupled to the power supply terminal and its anode coupled to a first common node. The fourth diode has its cathode coupled to the first common node and its anode coupled to the common reference node. The fifth diode has its cathode coupled to the power supply terminal and its anode coupled to a second common node. The sixth diode has its cathode coupled to the second common node and its anode coupled to the common reference node.

The first inductor is coupled between the first common node and the cathode of the first diode. The second inductor is coupled between the first common node and the anode of the first diode. The third inductor is coupled between the second common node and the cathode of the second diode. The fourth inductor is coupled between the second common node and the anode of the second diode. Lastly, a first output terminal is coupled to the first node and a second output terminal is coupled to the second node. A load can be coupled between the first and second output terminals.

In a sixth embodiment of the present invention, each of the four switches of the fifth embodiment is implemented with a MOSFET or two MOSFETs connected in parallel. Further, a capacitor can be optionally coupled across the third, fourth, fifth, and sixth diode, in the sixth embodiment.

As discussed above, the full-bridge amplifier of the present invention has many applications. One of which is in the field of induction heating. For example, a full-bridge amplifier according to any one of the embodiments of the present invention can be used in an RF power supply of an induction heating apparatus. An RF power supply according to the present invention includes a full-bridge amplifier according to any one of the above embodiments, a constant DC voltage source, and an RF signal generator. An induction heating apparatus that makes use of the present invention experiences greater reliability than conventional induction heaters.

Other features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

FIG. 10 illustrates an induction heating apparatus according to the present invention.

FIG. 11 is a circuit diagram illustrating a parallel resonant tank circuit and a work piece.

DETAILED DESCRIPTION OF THE PREFERRED EMBODIMENTS

The present invention provides a full-bridge amplifier that is much less likely to experience device failure when driving capacitive loads than a conventional full-bridge amplifier. A full-bridge amplifier according to the present invention is able to recover reactive energy produced by a capacitive load that would otherwise be dissipated in the switches of the amplifier causing device failure. Additionally, a full-bridge amplifier according to one of the embodiments of the present invention is able to operate over a broad-band of radio frequencies. The full-bridge amplifiers according to the present invention can be used to create improved RF power supplies for use in, among other things, induction heating and plasma generation applications.

Figure 1:
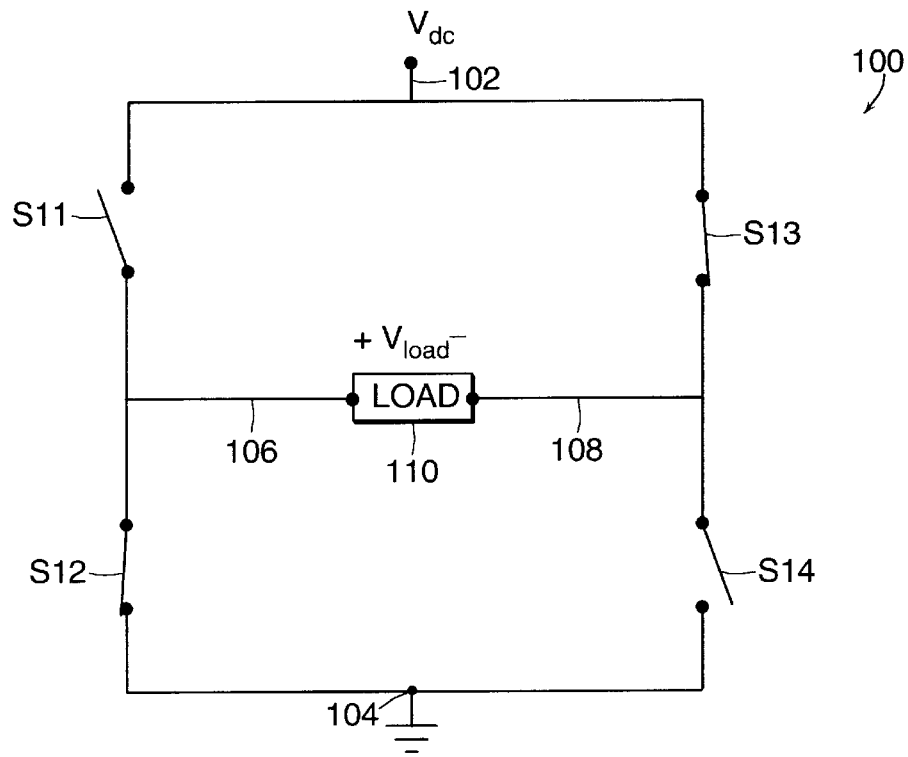
FIG. 1 is a circuit diagram depicting a conventional full-bridge switch-mode amplifier.
Figure 2:
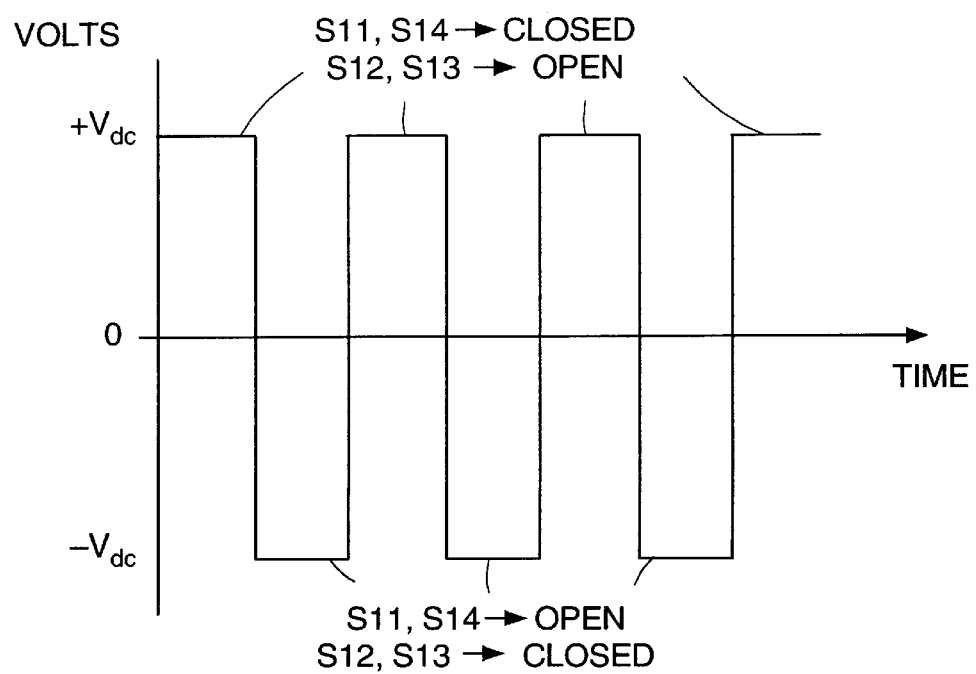
FIG. 2 is a graph plotting voltage versus time for the output voltage of a full-bridge switch-mode amplifier.

A brief review of the conventional full-bridge amplifier helps describe the present invention. A conventional full-bridge amplifier 100 is depicted in FIG. 1. The conventional fill-bridge topology consists simply of four switches (S11, S12, S13, and S14), a DC power supply terminal 102 for connecting to a constant DC power source, a common reference node 104, and two output terminals 106 and 108 for connecting to a load 110. When switch S11 and switch S14 are open and switch S12 and switch S13 are closed the voltage across load 110 ($V_{load}$) is equal to $V_{dc}$, where $V_{dc}$ is the voltage between the power supply terminal and reference node 104. When switch S11 and switch S14 are closed and switch S12 and switch S13 are open $V_{load}$ is equal to $-V_{dc}$. Consequently, a square wave voltage can be provided to the load by alternating between the state where switch S11 and switch S14 are open and switch S12 and switch S13 are closed and the state where switch S11 and switch S14 are closed and switch S12 and switch S13 are open. The frequency of the square wave voltage is determined by how quickly the circuit alternates between the first state and the second state. A graph plotting $V_{load}$ versus time is shown in FIG. 2. As the graph shows, $V_{load}$ is equal to $V_{dc}$ when switches S11 and S14 are open and switches S12 and S13 are closed, and $V_{load}$ is equal to $-V_{dc}$ when switches S11 and S14 are closed and switches S12 and S13 are open.

Figure 3:
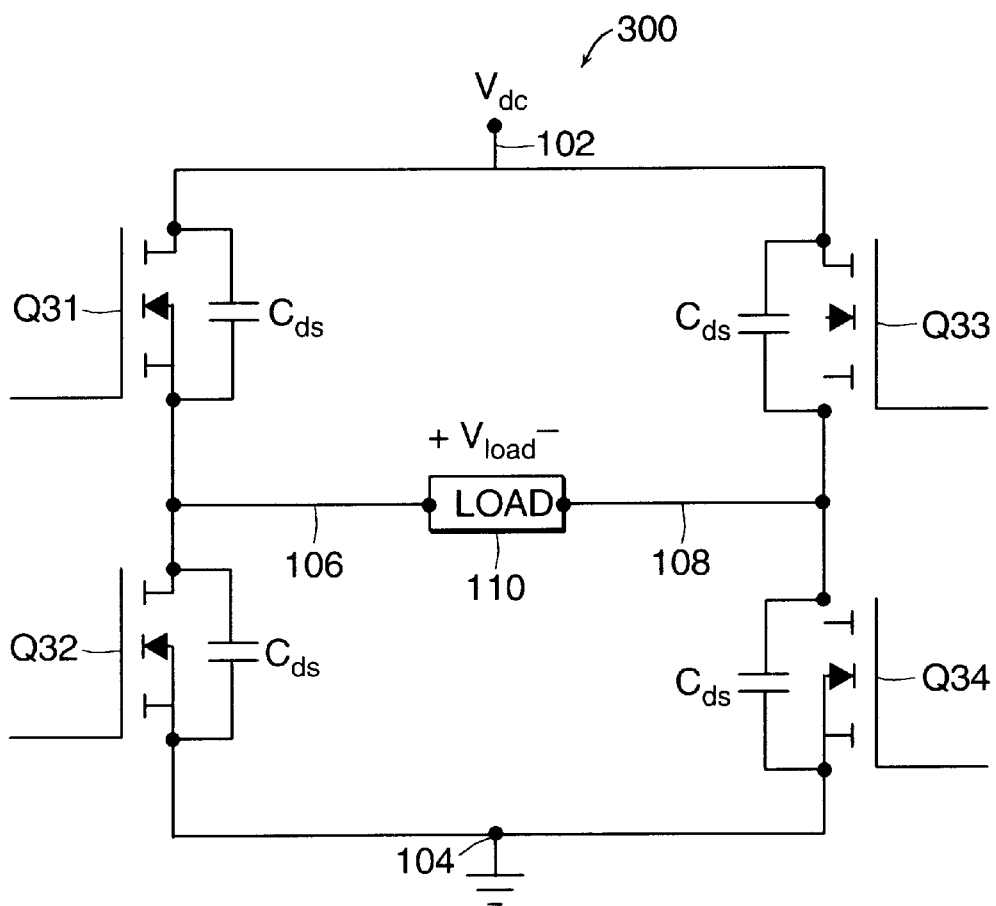
FIG. 3 is a circuit diagram depicting a conventional full-bridge switch-mode amplifier implemented with MOSFETs.

In practice, switches S11–S14 are implemented with transistors, such as metal oxide semiconductor field effect transistors (MOSFETs), as shown in FIG. 3. $C_{ds}$ represents the drain to source parasitic capacitance (or output capacitance) of each MOSFET. A disadvantage of full-bridge amplifier 300 shown in FIG. 3, is that when load 110 is capacitive, MOSFETs Q31–Q34 experience a large current spike when they transition from the off state (i.e., switch open) to the on state (i.e., switch closed). The large current spike is caused by the discharging of the capacitive load 110. Large current spikes on MOSFET turn on transitions can cause the device to deviate outside of safe operating limits causing complete device failure.

The conventional full-bridge topology has at least one other disadvantage. The large rates of change in voltage across Q31 and Q34 that occurs when Q32 and Q33 turn on quickly can couple through the Miller capacitance in Q31 and Q34, turning them on, thereby creating a destructive cross-conduction condition.

Figure 4:
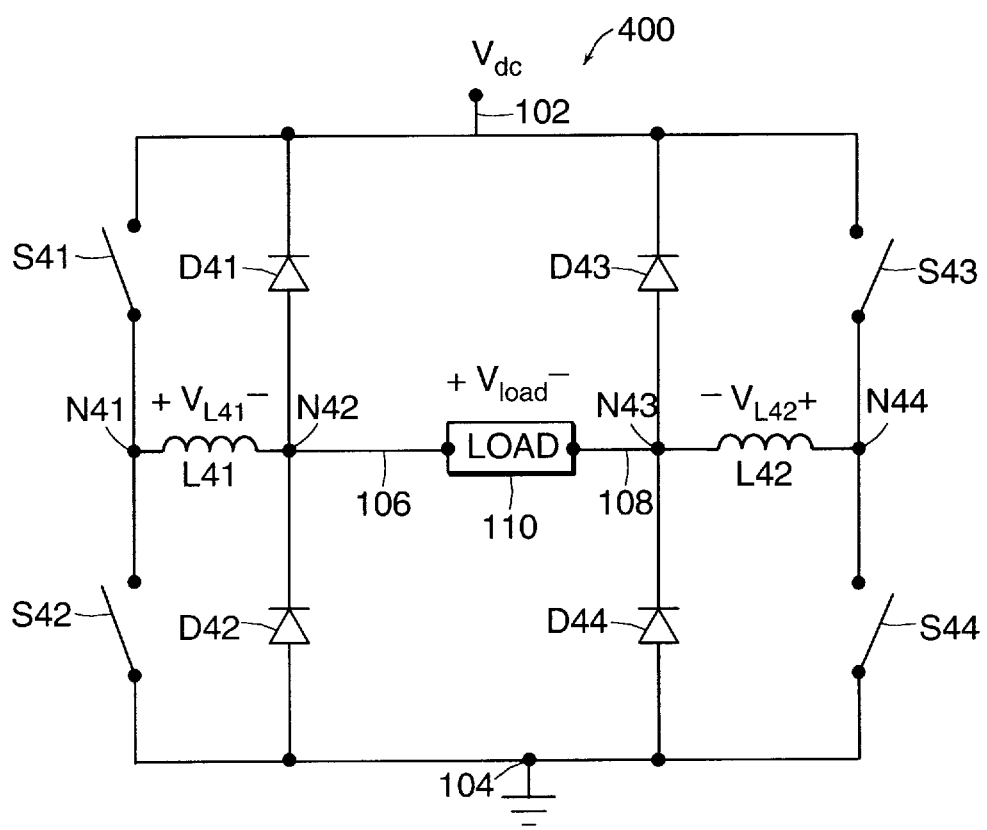
FIG. 4 is a circuit diagram depicting a full-bridge amplifier according to a first embodiment of the present invention.

A solution recognized by the inventor to overcome the above disadvantages is to add two inductors (L41 and L42), and four diodes (D41–D44) to the conventional full-bridge circuit, as shown in FIG. 4. The topology off full-bridge amplifier 400, shown in FIG. 4, is termed an "inductive clamp topology." The inductive clamp topology provides a means for recovering capacitive reactive energy, whereas capacitive reactive energy in the conventional amplifier was dissipated in the MOSFETs, which can cause device failure. If carefully implemented, the inductive clamp topology can also implement zero voltage switching (ZVS). ZVS is a technique to ensure that the voltage across a switch is zero as the device turns on or off.

As shown in FIG. 4, the first embodiment of the present invention includes four switches (S41–S44), two inductors (L41 and L42), four diodes (D41–D44), power supply terminal 102, and reference node 104. Switch S41 is connected between power supply terminal 102 and common node N41. Switch S42 is connected between node N41 and a common reference node 104. Switch S43 is connected between power supply terminal 102 and node N44. Switch S44 is connected between node N44 and reference node 104. Inductor L41 is connected between node N41 and node N42. Inductor L42 is connected between node N43 and node N44. Diode D41 is connected between power supply terminal 102 and node N42. Diode D42 is connected between node N42 and reference node 104. Diode D43 is connected between power supply terminal 102 and node N43. Diode D44 is connected between node N43 and reference node 104. Diodes with minimal reverse recovery charge are recommended. Particularly, Harris hyper-fast recovery diodes or Schottky rectifiers are recommended for applications much beyond 500 KHz, and ultrafast recovery rectifiers should be considered for frequencies below 500 KHz. To minimize reverse recovery losses, careful attention should be paid to keeping the voltage near zero for the reverse recovery time of these rectifiers. This can be achieved by placing an appropriate capacitor across the device.

Load 110 is placed between output terminals 106 and 108. Output terminal 106 is connected to node N42, and output terminal 108 is connected to node N43. In a first circuit state where S41 and S44 are closed and S42 and S43 are open, load voltage ($V_{load}$) is equal to $V_{dc}$. In a second circuit state where S41 and S44 are open and S42 and S43 are closed, $V_{load}$ is equal to $-V_{dc}$. By alternating between the first and second state, a square wave voltage as shown in FIG. 2 can be produced at the load.

Figure 6:
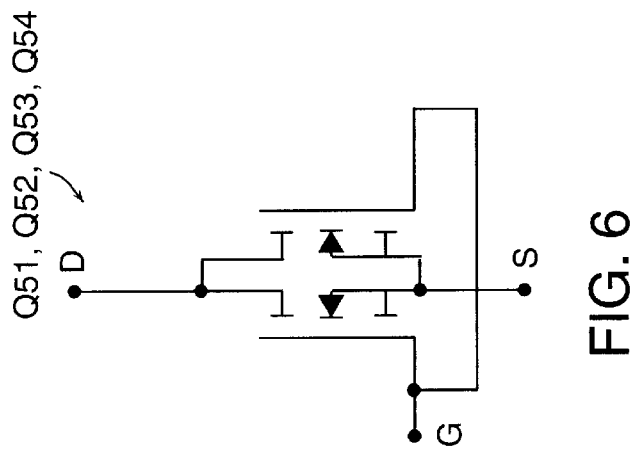
FIG. 6 is a circuit diagram depicting a switch implemented by two MOSFETs connected in parallel.
Figure 5:
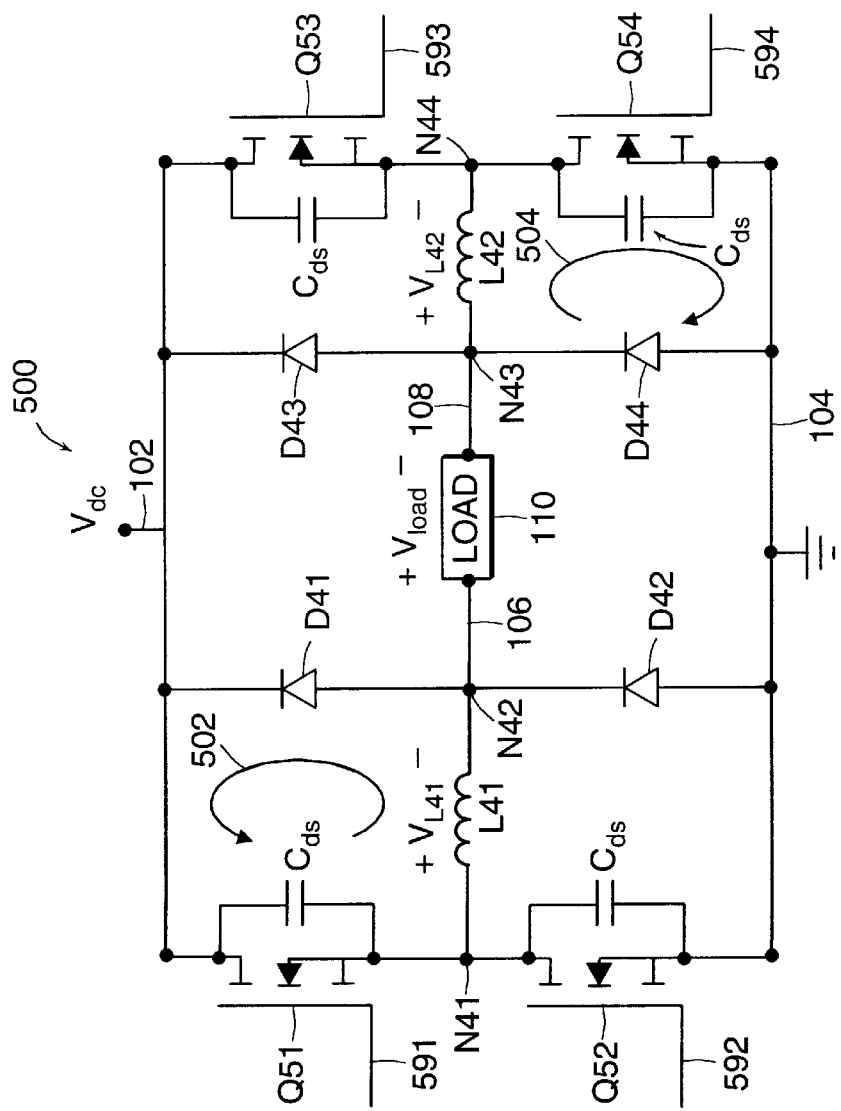
FIG. 5 is a circuit diagram depicting a full-bridge amplifier according to a second embodiment of the present invention.

Switches S41–S44 can be implemented with a variety of devices, such as MOSFETs. If other transistors are used to implement the switches, a diode should be placed across the transistor such that the diode's anode is connected to the transistor's emitter/source and the diodes's cathode is connected to the transistor's collector/drain. In a second embodiment of the present invention, which is depicted in FIG. 5, switches S41–S44 are implemented with enhancement mode MOSFET devices. Depletion mode MOSFET devices as well as other devices could also be used. Each MOSFET device Q51–Q54 has a parasitic drain to source capacitance represented by capacitor $C_{ds}$. It is recommended to use International Rectifier IRFP360LC MOSFETs due to their low Miller capacitance. Low Miller capacitance offers excellent protection against cross-conduction, and less gate charge is required to saturate the device. In a third embodiment of the present invention, each MOSFET device Q51–Q54 is composed of two MOSFETs connected in parallel, as shown in FIG. 6.

An analysis of the second embodiment where the load is capacitive will now be described. Given a capacitive load, when MOSFETs Q51 and Q54 are on and saturated and MOSFETs Q52 and Q53 are off, Vload equals Vdc and diodes D41 and D44 start conducting, storing reactive energy in two loops 502 and 504. By storing the reactive energy as loop current in loops 502 and 504, the reactive energy is not dissipated in the MOSFETs. Loop 502 includes inductor L41, MOSFET Q51, and diode D41, and loop 504 includes inductor L44, MOSFET Q54, and diode D44. Assuming no diode or MOSFET losses, the current in each loop remains constant until the MOSFET in each loop turns off. The current in each loop can be determined using the following equation: $I_{loop502} = I_{loop504} = V_{dc} * (2 * C_{load}/(L_{41} + L_{42}))^{1/2}$, where $C_{load}$ is the capacitance of load 402.

When Q51 and Q54 turn off, the respective loop currents will charge $C_{ds}$ for Q51 and Q54 and will discharge $C_{ds}$ for Q52 and Q53. If the loop currents are great enough, $C_{ds}$ for Q52 and Q53 will discharge causing the drain to source voltage ($V_{ds}$) for Q52 and Q53 to approach zero volts. Thus no losses will be incurred when Q52 and Q53 turn on. That is, the circuit has achieved zero voltage switching.

The amount of time it takes a loop current to discharge $C_{ds}$ is determined by the following formula: time=$0.5*\pi*$ $(2*L_{41}*C_{ds})^{1/2}$. Thus, to ensure zero voltage switching, after Q51 and Q54 turn off, Q52 and Q53 should not turn on until the above amount of time has elapsed. This amount of time is known as the dead time. It is the amount of time that all four MOSFETs are in the off state. The above equation assumes that L41=L42.

The minimum amount of loop current to ensure zero voltage switching is determined as follows: $I_{loop}=V_{dc}*(2*C_{ds}/L)^{1/2}$, where L is the value of the inductor in the loop. The maximum value for L41 and L42 in Henries is determined by the following formula: $L41_{max}=L42_{max}=(V_{dcmax})^2/31.03/F_{max}/P_{max}$, where $F_{max}$ is the maximum operating frequency in hertz, and $P_{max}$ is the maximum output power in watts. In one embodiment of the present invention, $P_{max}$ is 3500 watts, $V_{dcmax}$ is 250 volts, and $F_{max}$ is 1 Mhz. Using these values we determine that $L41_{max}=L42_{max}=0.58$ micro Henries ($\mu$H). In practice, L41 and L42 are chosen to be 0.50 $\mu$H. Additionally, the parasitic drain capacitance ($C_{ds}$) of each MOSFET Q51–Q54 is 1 nano farade (nF).

Given the above parameters the dead time is determined as follows:

$$t=0.5*\pi*(L_{41}*C_{ds})^{1/2}=0.5*\pi*(2*0.50 \, \mu H *1 \, nF)^{1/2}=50 \text{ nano seconds (ns)}.$$

Fifty nano seconds is a short dead time. In practice, the dead time was increased by adding additional capacitance across each MOSFET Q51–Q54 to increase $C_{ds}$. Specifically, an additional 1 nF capacitance was added across each MOSFET Q5 1 Q54, thereby increasing $C_{ds}$ from 1 nF to 2 nF. The dead time is therefore increased to 70ns.

The minimum amount of loop current that will ensure zero voltage switching can now be determined as follows: $I_{zvsmin}=V_{dcmax}*(2*C_{ds}/L_{41})^{1/2}=250*(2*2 \text{ nF}/0.50 \, \mu H)^{1/2}=22.3$ Amperes. A good goal is to keep $I_{zvsmin}$ at or below one-half the maximum operating current.

Figure 7:
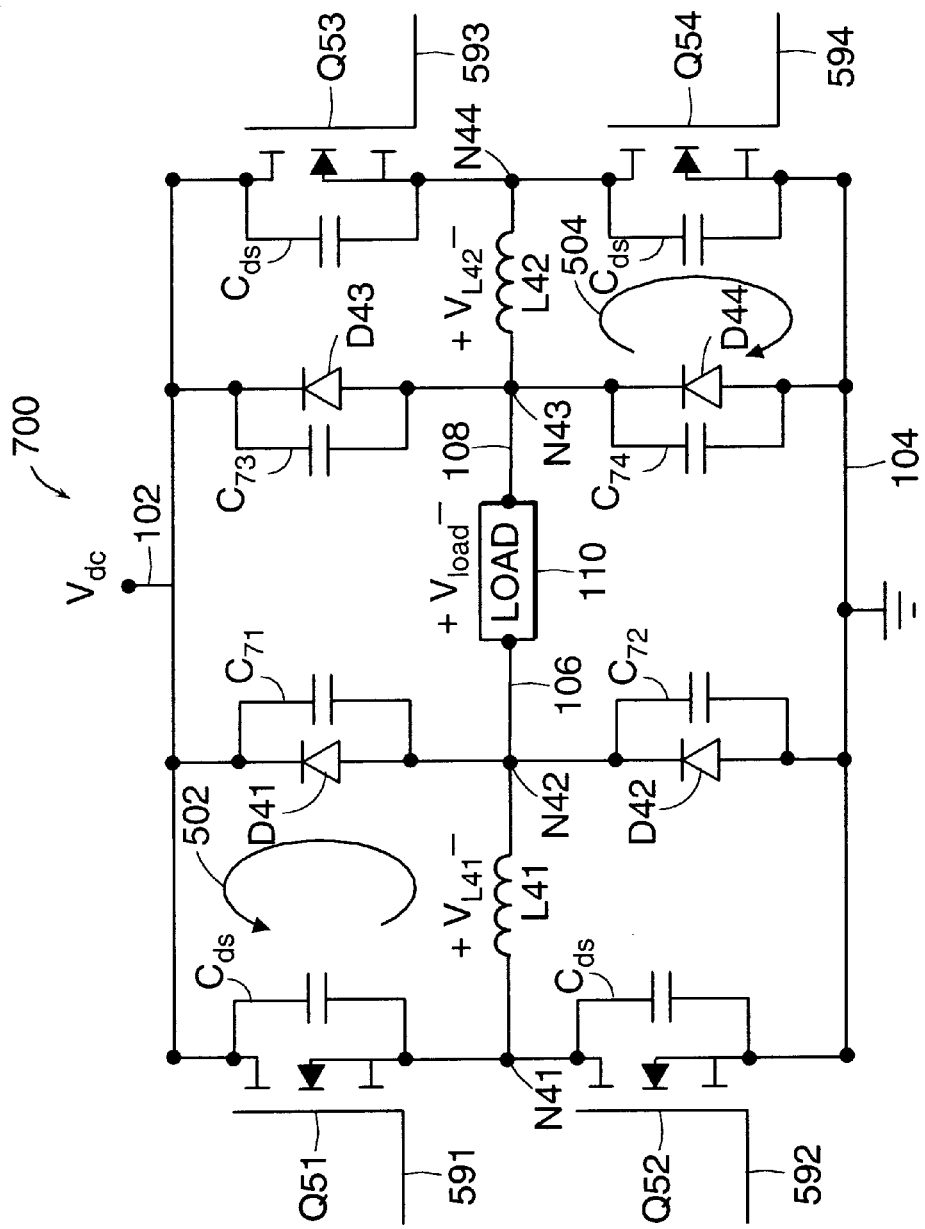
FIG. 7 is a circuit diagram depicting a full-bridge amplifier according to a fourth embodiment of the present invention.

In a fourth embodiment of the present invention, which is depicted in FIG. 7, 1 nF capacitors (C71–C74) are connected across diodes D41, D42, D43, and D44. The purpose of adding capacitors C71–C74 is twofold. First, capacitors C71–C74 force current through inductors L41 and L42 in a no load situation, which decreases the rate of change of voltage on MOSFETs Q51–Q54. Second, the capacitors C71–C74 hold the voltages across their respective diodes to near zero volts during reverse recovery, thereby minimizing diode reverse recovery losses.

Figure 8:
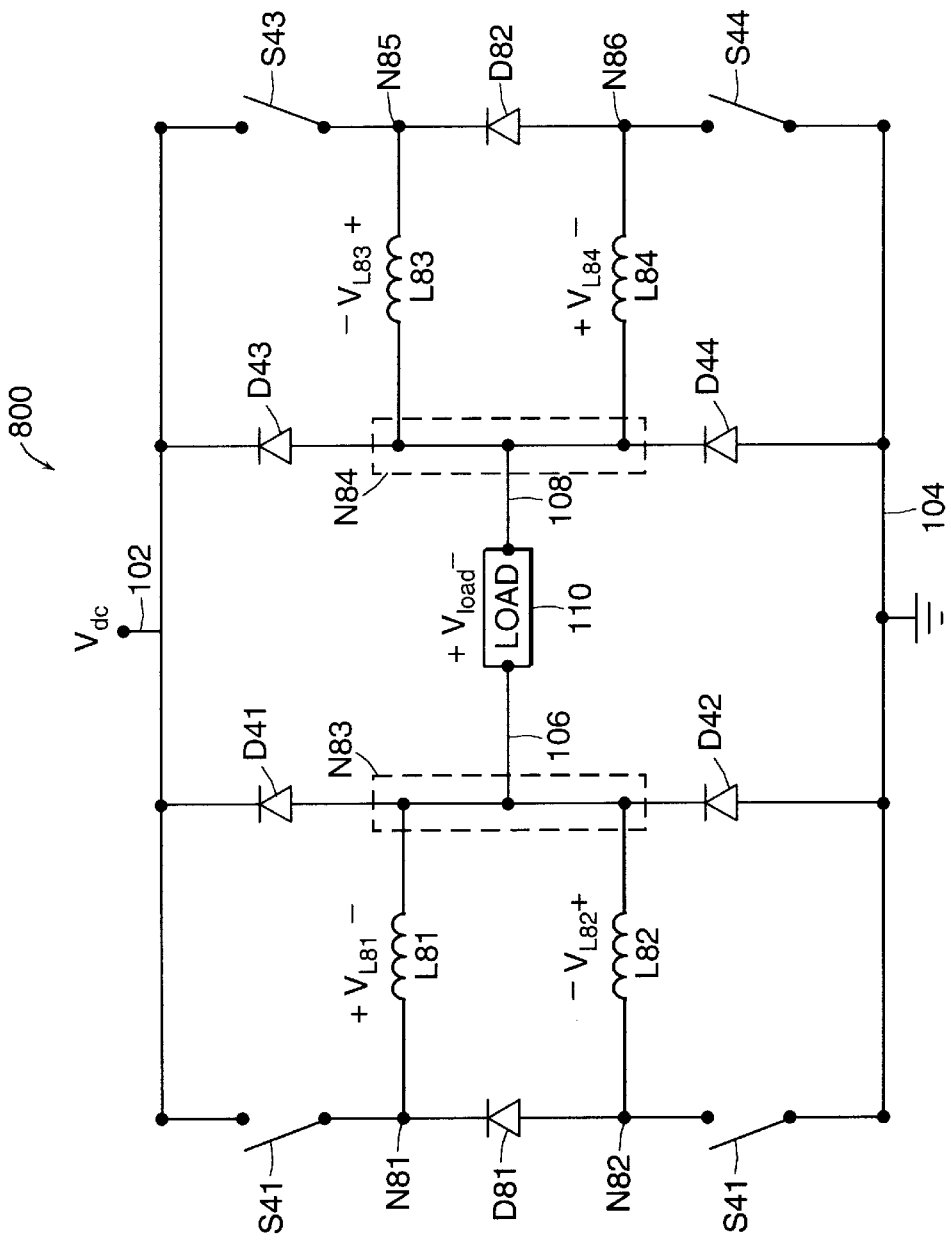
FIG. 8 is a circuit diagram depicting a full-bridge amplifier according to a fifth embodiment of the present invention.

The inductive clamp topology shown in FIGS. 4–7 provides zero voltage switching (ZVS) in the frequency range of 100 KHz to 1.0 Mhz. But it does not achieve ZVS at frequencies below 100 KHz. A fifth embodiment of the present invention, which is depicted in FIG. 8, achieves ZVS over the 50 KHz to 1.0 Mhz frequency range. In addition, the circuit provides inherent cross-conduction protection. The fifth embodiment of the present invention is a variation of the inductive clamp topology depicted in FIG. 4. The fifth embodiment adds two diodes (D81 and D82) to the first embodiment and contains four inductors (L81–L84) as opposed to two inductors (L41 and L42). Like diodes D41–D44, it is recommended that diodes D81 and D82 have minimal reverse recovery charge. Particularly, Harris hyperfast recovery diodes or Schottky rectifiers are recommended for applications much beyond 500 KHz, and ultrafast recovery rectifiers should be considered for frequencies below 500 KHz. To minimize reverse recovery losses, careful attention should be paid to keeping the voltage near zero for the reverse recovery time of these rectifiers. This can be achieved by placing an appropriate capacitor across the device.

As shown in FIG. 8, switch S41 is connected between power supply terminal 102 and node N81. Switch S42 is connected between node N82 and common reference node 104. Switch S43 is connected between power supply terminal 102 and node N85. Switch S44 is connected between node N86 and common reference node 104. Diode D81 has a cathode connected to node N81 and an anode connected to node N82. Diode D41 has a cathode connected to power supply terminal 102 and an anode connected to node N83. Diode D42 has a cathode connected to node N83 and an anode connected to the common reference node 104. Diode D43 has a cathode connected to power supply terminal 102 and an anode connected to node N84. Diode D44 has a cathode connected to node N84 and an anode connected to the common reference node 104. Diode D82 has a cathode connected to node N85 and an anode connected to node N86. First inductor L81 is connected between node N81 and node N83. Second inductor L82 is connected between node N82 and node N83. Third inductor L83 is connected between node N84 and node N85. Fourth inductor L84 is connected between node N84 and node N86. In the preferred embodiment, all four inductors (L81, L82, L83, and L84) have the same amount of inductance.

Figure 9:
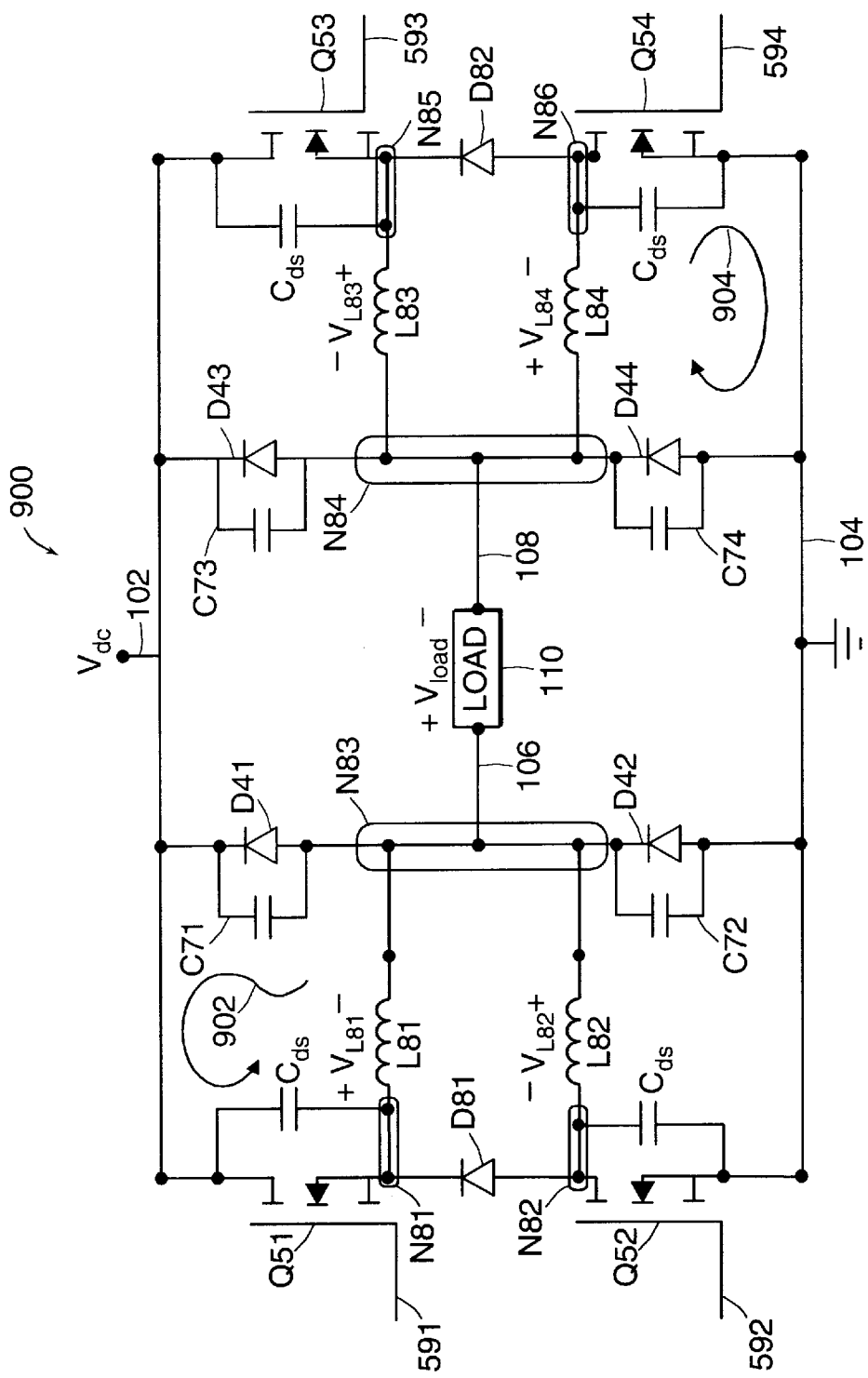
FIG. 9 is a circuit diagram depicting a full-bridge amplifier according to a sixth embodiment of the present invention.

Like the switches of the first embodiment, the switches of the fifth embodiment can be implemented with a variety of devices. FIG. 9 illustrates a sixth embodiment of the present invention where the switches of the fifth embodiment are implemented with the same MOSFET devices as the switches of the second or third embodiments. Furthermore, FIG. 9 illustrates that capacitors C71–C74 can optionally be connected across diodes D41–D44, respectively.

The sixth embodiment behaves similarly to the second embodiment. That is, given a capacitive load, when Q51, Q54 are on and saturated and Q52, Q53 are off, $V_{load}$ is equal to $V_{dc}$ and diodes D41 and D44 start conducting, which causes reactive energy to be stored in two loops (902 and 904). Loop 902 consists of L81, D41, and Q51. Loop 904 consists of L84, D44, and Q54. Assuming no losses in diodes or MOSFETs, the current in each loop remains constant until Q51 and Q54 turn off. The loop current is determined by the following formula: $I_{902}=I_{904}=V_{dc}*(2*C_{load}/(L_{81}+L_{84}))^{1/2}$, where $C_{load}$ is the capacitance of load 110.

When Q51 and Q54 turn off, the parasitic capacitances ($C_{ds}$) keep the drain to source voltage for Q51 and Q54 at zero volts while each device turns off. Once off, the current in loop 902 will charge $C_{ds}$ for Q51 and discharge $C_{ds}$ for Q52 through diode D81, and the current in loop 904 will charge $C_{ds}$ for Q54 and discharge $C_{ds}$ for Q53 through diode D82. Note, at this point $VL81=-VL82$ and $VL84=-VL83$, which starts current flowing through inductor L82 and inductor L83. Note also that while current flows through diode D81 inductors L81 and L82 appear as if they are in parallel with each other. Similarly, while current flows through diode D82 inductors L83 and L84 also appear in parallel to each other. If the loop currents are great enough, $C_{ds}$ for Q52 and Q53 will discharge causing the drain to source voltage ($V_{ds}$) for Q52 and Q53 to approach zero volts. Thus no losses will be incurred when Q52 and Q53 turn on. That is, the circuit has achieved zero voltage switching.

The amount of time it takes a loop current to discharge $C_{ds}$ is determined by the following formula:

$$\text{time}=0.5*\pi*(L_{81}*C_{ds})^{1/2}.$$

Thus, to ensure zero voltage switching, after Q51 and Q54 turn off, Q52 and Q53 should not turn on until the above amount of time has elapsed. As stated above, this amount of time is referred to as dead time. The above equation assumes that all of the inductors in the circuit have the same value.

The minimum amount of loop current to ensure zero voltage switching is determined as follows:

$$I_{min} = Vdc*(2*C_{ds}/L)^{1/2},$$

where L is the value of the inductor in the loop. The maximum value for L81–L84 in Henries is determined as follows:

$$L81_{max} = L82_{max} = L83_{max} = L84_{max} = (V_{dcmax})^2 / 15.52/F_{max}/P_{max}.F_{max}$$

is the maximum operating frequency in hertz, and $P_{max}$ is the maximum output power in watts. In one embodiment of the present invention, $P_{max}$ is 3500 watts, $V_{dcmax}$ is 250 volts, and $F_{max}$ is 1 Mhz. Using these values we determine that $L81_{max} = L82_{max} = L83_{max} = L84_{max} = 1.15 \mu H$. In practice L81, L82, L83, and L84 are chosen to be 1 $\mu H$. Additionally, the parasitic drain capacitance ($C_{ds}$) of each MOSFET Q51–Q54 is 1 nF.

Given the above parameters the dead time is determined as follows:

$$t = 0.5*\pi*(L_{81}*C_{ds})^{1/2} = 0.5*\pi*(1 \mu H * 1 \text{ nF})^{1/2} = 50 \text{ nano seconds (ns)}.$$

Fifty nano seconds is a short dead time. In practice, the dead time was increased by adding additional capacitance across each MOSFET Q51–Q54 to increase $C_{ds}$. Specifically, an additional 1 nF capacitance was added across each MOSFET Q51–Q54, thereby increasing $C_{ds}$ from 1 nF to 2 nF. The dead time is therefore increased to 70 ns.

The minimum amount of loop current that will ensure zero voltage switching can now be determined as follows:

$$I_{zvsmin} = V_{dcmax}*(2*C_{ds}/L_{81})^{1/2} = 250*(2*2 \text{ nF}/1 \mu H)^{1/2} = 15.8 \text{ amperes}.$$

A good goal is to keep $I_{zvsmin}$ at or below one-half the maximum operating current.

The maximum value calculated for inductors L81–L84 is approximately twice the value calculated for the two inductors (L41 and L42) of the first embodiment. Consequently, the fifth embodiment is able to hold twice the energy of the inductive clamped topology of the first embodiment. Hence, the topology shown in FIG. 8 can keep the switches on longer than the topology of FIG. 4, thereby providing lower frequencies while still providing zero voltage switching. The fifth embodiment therefore achieves zero voltage switching over the 50 KHz–1.0 Mhz frequency range.

The full-bridge amplifiers according to the present invention have many uses. For example, they can be used as a component in an RF power supply. An RF power supply according to the present invention can be used in induction heating and plasma generation applications, for example. FIG. 10 is a block diagram illustrating an induction heating apparatus 1000 according to the present invention. Induction heating apparatus 1000 includes an RF power supply 1002 and a tank circuit 1010.

RF power supply 1002 provides a high power, RF alternating voltage to tank circuit 1010. RF power supply 1002 includes full-bridge amplifier 1008 according to any one of the embodiments of the present invention. RF power supply 1002, according to the present invention, further includes a constant DC power source 1004 and an RF signal generator 1006. DC power source 1004 is connected to power supply terminal 102 of full-bridge amplifier 1008. RF signal generator 1006 has four outputs. Each output is connected to a gate (591–594) of one of the switching devices within full-bridge amplifier 1008. RF signal generator 1006 controls the switching of the switching devices within full-bridge amplifier 1008. That is, it controls whether a given switch is in an on or off state. RF signal generator thus controls the wave form and frequency of the voltage provided to tank circuit 1010. RF signal generator 1006 includes a tuner (not shown) that monitors the admittance of tank circuit 1010 through feedback 1024 and tunes signal generator 1006 so that the frequency of the alternating voltage applied to tank circuit 1010 matches tank circuit 1010's resonant frequency.

Output terminals 106 and 108 of full-bridge amplifier 1008 are coupled to tank circuit 1010 through RF cables 1020 and 1022. RF power supply 1002 is further described in copending U.S. patent application Ser. No. 09/113,518, entitled "RF Power Supply," filed by Thompson et al. on Jul. 10, 1998, assigned to the assignee of the present invention and incorporated by reference in its entirety herein.

In one embodiment of the present invention, tank circuit 1010 is a parallel resonant tank circuit having a capacitor 1110 connected in parallel with inductor coil 1112, as shown in FIG. 11. As one skilled in the relevant art will realize, a variety of tank circuits could be used, including a series resonant tank circuit. The alternating voltage provided to tank circuit 1010 by RF power supply 1002 creates an alternating current in inductor coil 1112. This alternating current generates an alternating magnetic field within inductor coil 1112. When work piece 1114 is placed within the inductor coil 1112, the alternating magnetic field cuts through the work piece. Eddy currents are thereby induced within work piece 1114. It is these eddy currents that heat the work piece.

As discussed above, the full-bridge amplifiers according to the present invention are able to provide power to all types of loads, including capacitive loads. Additionally, a full-bridge amplifier according to one of the embodiments of the present invention is able to achieve zero voltage switching over a broad range of frequencies. These features make induction heating apparatus 1000 more reliable than was previously possible. For example, it is desirable to locate the tank circuit away from the RF power supply. This is accomplished by placing RF cables 1020 and 1024 between the RF power supply 1002 and the tank circuit 1010. RF cables 1020 and 1022 transmit the RF energy produced at the RF power supply 1002 to the remotely located tank circuit 1010. If the impedance of the RF cables 1020, 1022 do not match the real resistance of the tank circuit 1010 at resonance, the load may appear capacitive. This would cause problems for a conventional RE power supply, but it does not cause problems for the RF power supply according to the present invention because it is able to provide power to capacitive loads. According to one embodiment, RE cables 1020 and 1022 can be up to 200 feet in length.

While various embodiments of the present invention have been described above, it should be understood that they have been presented by way of example, and not limitation. It will be understood by those skilled in the art that various changes in form and detail may be made therein without departing from the spirit and scope of the invention as defined by the following claims. Thus the breadth and scope of the present invention should not be limited by any of the above-described exemplary embodiments, but should be defined only in accordance with the following claims and their equivalents.

What is claimed is:

1. An RF power supply, comprising:
   an amplifier comprising means for producing an alternating voltage and for recovering reactive energy produced by a capacitive load;
   a direct current (dc) power source to provide dc power to said amplifier; and
   a frequency generator to control the frequency of said alternating voltage produced by said amplifier.

2. The RF power supply of claim 1, wherein said amplifier further comprises means for delivering up to 3.5 kilowatts of power over a frequency range of about 50 kHz to about 1.0 MHz.

3. The RF power supply of claim 1, wherein said means for producing an alternating voltage and for recovering reactive energy produced by a capacitive load comprises:
   a first, second, third, and fourth switch;
   a first, second, third, fourth, fifth, and sixth diode, each diode having a cathode and an anode; and
   a first, second, third, and fourth inductor, wherein
   said first switch is coupled between said dc power source and said cathode of said first diode,
   said second switch is coupled between said anode of said first diode and a common reference node,
   said third switch is coupled between said dc power source and said cathode of said second diode,
   said fourth switch is coupled between said anode of said second diode and said common reference node,
   said cathode of said third diode is coupled to said dc power source, and said anode of said third diode is coupled to a first node,
   said cathode of said fourth diode is coupled to said first node, and said anode of said fourth diode is coupled to said common reference node,
   said cathode of said fifth diode is coupled to said dc power source, and said anode of said fifth diode is coupled to a second node,
   said cathode of said sixth diode is coupled to said second node, and said anode of said sixth diode is coupled to said common reference node,
   said first inductor is coupled between said first node and said cathode of said first diode,
   said second inductor is coupled between said first node and said anode of said first diode,
   said third inductor is coupled between said second node and said cathode of said second diode, and
   said fourth inductor is coupled between said second node and said anode of said second diode.

4. The RF power supply of claim 3, further comprising a first output terminal coupled to said first node and second output terminal coupled to said second node, wherein a tank circuit is coupled to said first and second output terminals.

5. The RF power supply of claim 4, wherein said tank circuit is a parallel resonant tank circuit.

6. The RF power supply of claim 3, wherein each of said first, second, third, and fourth switch is a transistor.

7. The RF power supply of claim 6, wherein said transistor is an enhancement mode metal oxide field effect transistor.

8. The RF power supply of claim 6, wherein said transistor is a depletion mode metal oxide field effect transistor.

9. The RF power supply of claim 3, wherein each of said first, second, third, and fourth switch comprises two metal oxide field effect transistors connected in parallel.

10. The RF power supply of claim 3, further comprising a first, second, third, and fourth capacitor, wherein said first capacitor is coupled across said third diode, said second capacitor is coupled across said fourth diode, said third capacitor is coupled across said fifth diode, and said fourth capacitor is coupled across said sixth diode.

11. The RF power supply of claim 1, wherein said means for producing an alternating voltage and for recovering reactive energy produced by a capacitive load comprises:
    a first, second, third, and fourth switch;
    a first, second, third, and fourth diode, each diode having a cathode and an anode; and
    a first and second inductor, wherein
    said first switch is coupled between said dc power source and a first common node,
    said second switch is coupled between said first common node and a common reference node,
    said third switch is coupled between said dc power source and a second common node,
    said fourth switch is coupled between said second common node and said common reference node,
    said cathode of said first diode is coupled to said dc power source, and said anode of said first diode is coupled to a third common node,
    said cathode of said second diode is coupled to said third common node, and said anode of said second diode is coupled to said common reference node,
    said cathode of said third diode is coupled to said dc power source, and said anode of said third diode is coupled to said fourth common node,
    said cathode of said fourth diode is coupled to said fourth common node, and said anode of said fourth diode is coupled to said common reference node,
    said first inductor is coupled between said first common node and said third common node, and
    said second inductor is coupled between said second common node and said fourth common node.

12. The RF power supply of claim 11, further comprising a first output terminal coupled to said third node and second output terminal coupled to said fourth node, wherein a tank circuit is coupled to said first and second output terminals.

13. The RF power supply of claim 12, wherein said tank circuit is a parallel resonant tank circuit.

14. The RF power supply of claim 11, wherein each of said first, second, third, and fourth switch is a transistor.

15. The RF power supply of claim 14, wherein said transistor is an enhancement mode metal oxide field effect transistor.

16. The RF power supply of claim 15, wherein said transistor is a depletion mode metal oxide field effect transistor.

17. The RF power supply of claim 11, wherein each of said first, second, third, and fourth switch comprises two metal oxide field effect transistors connected in parallel.

18. The RF power supply of claim 11, further comprising a first, second, third, and fourth capacitor, wherein said first capacitor is coupled across said first diode, said second capacitor is coupled across said second diode, said third capacitor is coupled across said third diode, and said fourth capacitor is coupled across said fourth diode.

19. A full-bridge amplifier comprising:
    a first, second, third, and fourth switch;
    a first, second, third, and fourth diode, each diode having a cathode and an anode; and
    a first and second inductor, wherein
    said first switch is coupled between a power supply terminal and a first common node, said second switch is coupled between said first common node and a common reference node, said third switch is coupled between said power supply terminal and a second common node, said fourth switch is coupled between said second common node and said common reference node, said cathode of said first diode is coupled to said power supply terminal, and said anode of said first diode is coupled to a third common node, said cathode of said second diode is coupled to said third common node, and said anode of said second diode is coupled to said common reference node, said cathode of said third diode is coupled to said power supply terminal, and said anode of said third diode is coupled to said fourth common node, said cathode of said fourth diode is coupled to said fourth common node, and said anode of said fourth diode is coupled to said common reference node, said first inductor is coupled between said first common node and said third common node, and said second inductor is coupled between said second common node and said fourth common node.

20. The full-bridge amplifier of claim 19, further comprising a load being coupled between said third node and said fourth node.

21. The full-bridge amplifier of claim 19, wherein each of said first, second, third, and fourth switch is a transistor.

22. The full-bridge amplifier of claim 21, wherein said transistor is an enhancement mode metal oxide field effect transistor.

23. The full-bridge amplifier of claim 21, wherein said transistor is a depletion mode metal oxide field effect transistor.

24. The full-bridge amplifier of claim 19, wherein each of said first, second, third, and fourth switch comprises two metal oxide field effect transistors connected in parallel.

25. The full-bridge amplifier of claim 19, further comprising a first, second, third, and fourth capacitor, wherein said first capacitor is coupled across said first diode, said second capacitor is coupled across said second diode, third capacitor is coupled across said third diode, and said fourth capacitor is coupled across said fourth diode.

26. A fill-bridge amplifier, comprising:

a first, second, third, and fourth switch;

a first, second, third, fourth, fifth, and sixth diode, each diode having a cathode and an anode; and a first, second, third, and fourth inductor, wherein said first switch is coupled between a power supply terminal and said cathode of said first diode, said second switch is coupled between said anode of said first diode and a common reference node, said third switch is coupled between said power supply terminal and said cathode of said second diode, said fourth switch is coupled between said anode of said second diode and said common reference node, said cathode of said third diode is coupled to said power supply terminal, and said anode of said third diode is coupled to a first node, said cathode of said fourth diode is coupled to said first node, and said anode of said fourth diode is coupled to said common reference node, said cathode of said fifth diode is coupled to said power supply terminal, and said anode of said fifth diode is coupled to a second node, said cathode of said sixth diode is coupled to said second node, and said anode of said sixth diode is coupled to said common reference node, said first inductor is coupled between said first node and said cathode of said first diode, said second inductor is coupled between said first node and said anode of said first diode, said third inductor is coupled between said second node and said cathode of said second diode, and said fourth inductor is coupled between said second node and said anode of said second diode.

27. The full-bridge amplifier of claim 26, further comprising a load being coupled between said first node and said second node.

28. The full-bridge amplifier of claim 26, wherein each of said first, second, third, and fourth switch is a transistor.

29. The full-bridge amplifier of claim 28, wherein said transistor is an enhancement mode metal oxide field effect transistor.

30. The full-bridge amplifier of claim 28, wherein said transistor is a depletion mode metal oxide field effect transistor.

31. The full-bridge amplifier of claim 26, wherein each of said first, second, third, and fourth switch comprises two metal oxide field effect transistors connected in parallel.

32. The full-bridge amplifier of claim 26, further comprising a first, second, third, and fourth capacitor, wherein said first capacitor is coupled across said third diode, said second capacitor is coupled across said fourth diode, said third capacitor is coupled across said fifth diode, and said fourth capacitor is coupled across said sixth diode.

33. The RF power supply of claim 1, wherein said load comprises a tank circuit having at least one capacitor and at least one inductor connected in series.

34. The RF power supply of claim 1, wherein said load comprises a tank circuit having at least one capacitor and at least one inductor connected in parallel.

35. The RF power supply of claim 1, wherein said means for recovering reactive energy produced by a capacitive load recovers substantially all capacitive reactive energy produced by a capacitive load.

36. The RF power supply of claim 1, wherein said means for recovering reactive energy produced by a capacitive load recovers substantially all reactive energy produced by a capacitive load.

37. An RF power supply, comprising:

an amplifier comprising means for producing an alternating voltage and for recovering reactive energy produced by a capacitive load;

a direct current (dc) power source to provide dc power to said amplifier; and a frequency generator to control the frequency of said alternating voltage produced by said amplifier, wherein said means for producing an alternating voltage and for recovering substantially all reactive energy produced by a capacitive load comprises:

a first, second, third, and fourth switch;

a first, second, third, fourth, fifth, and sixth diode, each diode having a cathode and an anode; and a first, second, third, and fourth inductor, wherein said first switch is coupled between said dc power source and said cathode of said first diode, said second switch is coupled between said anode of said first diode and a common reference node, said third switch is coupled between said dc power source and said cathode of said second diode, said fourth switch is coupled between said anode of said second diode and said common reference node, said cathode of said third diode is coupled to said dc power source, and said anode of said third diode is coupled to a first node, said cathode of said fourth diode is coupled to said first node, and said anode of said fourth diode is coupled to said common reference node, said cathode of said fifth diode is coupled to said dc power source, and said anode of said fifth diode is coupled to a second node, said cathode of said sixth diode is coupled to said second node, and said anode of said sixth diode is coupled to said common reference node, said first inductor is coupled between said first node and said cathode of said first diode, said second inductor is coupled between said first node and said anode of said first diode, said third inductor is coupled between said second node and said cathode of said second diode, and said fourth inductor is coupled between said second node and said anode of said second diode.

38. The RF power supply of claim 37, further comprising a first output terminal coupled to said first node and second output terminal coupled to said second node, wherein a tank circuit is coupled to said first and second output terminals.

39. The RF power supply of claim 38, wherein said tank circuit is a parallel resonant tank circuit.

40. The RF power supply of claim 37, wherein each of said first, second, third, and fourth switch is a transistor.

41. The RF power supply of claim 40, wherein said transistor is an enhancement mode metal oxide field effect transistor.

42. The RF power supply of claim 40, wherein said transistor is a depletion mode metal oxide field effect transistor.

43. The RF power supply of claim 37, wherein each of said first, second, third, and fourth switch comprises two metal oxide field effect transistors connected in parallel.

44. The RF power supply of claim 37, further comprising a first, second, third, and fourth capacitor, wherein said first capacitor is coupled across said third diode, said second capacitor is coupled across said fourth diode, said third capacitor is coupled across said fifth diode, and said fourth capacitor is coupled across said sixth diode.

45. An RF power supply, comprising:

an amplifier comprising means for producing an alternating voltage and for recovering reactive energy produced by a capacitive load;

a direct current (dc) power source to provide dc power to said amplifier; and a frequency generator to control the frequency of said alternating voltage produced by said amplifier, wherein said means for producing an alternating voltage and for recovering reactive energy produced by a capacitive load comprises:

a first, second, third, and fourth switch;

a first, second, third, and fourth diode, each diode having a cathode and an anode; and a first and second inductor, wherein said first switch is coupled between said dc power source and a first common node, said second switch is coupled between said first common node and a common reference node, said third switch is coupled between said dc power source and a second common node, said fourth switch is coupled between said second common node and said common reference node, said cathode of said first diode is coupled to said dc power source, and said anode of said first diode is coupled to a third common node, said cathode of said second diode is coupled to said third common node, and said anode of said second diode is coupled to said common reference node, said cathode of said third diode is coupled to said dc power source, and said anode of said third diode is coupled to said fourth common node, said cathode of said fourth diode is coupled to said fourth common node, and said anode of said fourth diode is coupled to said common reference node, said first inductor is coupled between said first common node and said third common node, and said second inductor is coupled between said second common node and said fourth common node.

46. The RF power supply of claim 45, further comprising a first output terminal coupled to said third node and second output terminal coupled to said fourth node, wherein a tank circuit is coupled to said first and second output terminals.

47. The RF power supply of claim 46, wherein said tank circuit is a parallel resonant tank circuit.

48. The RF power supply of claim 45, wherein each of said first, second, third, and fourth switch is a transistor.

49. The RF power supply of claim 48, wherein said transistor is an enhancement mode metal oxide field effect transistor.

50. The RF power supply of claim 49, wherein said transistor is a depletion mode metal oxide field effect transistor.

51. The RF power supply of claim 45, wherein each of said first, second, third, and fourth switch comprises two metal oxide field effect transistors connected in parallel.

52. The RF power supply of claim 45, further comprising a first, second, third, and fourth capacitor, wherein said first capacitor is coupled across said first diode, said second capacitor is coupled across said second diode, said third capacitor is coupled across said third diode, and said fourth capacitor is coupled across said fourth diode.

* * * * *